US008400067B2

(12) United States Patent
Osame et al.

(10) Patent No.: US 8,400,067 B2
(45) Date of Patent: Mar. 19, 2013

(54) ELEMENT SUBSTRATE AND LIGHT EMITTING DEVICE

(75) Inventors: Mitsuaki Osame, Kanagawa (JP); Aya Anzai, Kanagawa (JP); Yu Yamazaki, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/480,550

(22) Filed: May 25, 2012

(65) Prior Publication Data

US 2012/0235128 A1    Sep. 20, 2012

Related U.S. Application Data

(60) Continuation of application No. 13/184,616, filed on Jul. 18, 2011, now Pat. No. 8,212,488, which is a continuation of application No. 11/562,626, filed on Nov. 22, 2006, now Pat. No. 8,004,200, which is a division of application No. 10/799,857, filed on Mar. 15, 2004, now Pat. No. 7,141,934.

(30) Foreign Application Priority Data

Mar. 26, 2003 (JP) ................................. 2003-086496
May 16, 2003 (JP) ................................. 2003-139554

(51) Int. Cl.
*G09G 3/10* (2006.01)
(52) U.S. Cl. ............... 315/169.3; 315/169.2; 315/169.1; 257/40; 257/99
(58) Field of Classification Search ............ 257/40; 315/169.3
See application file for complete search history.

(56) References Cited

U.S. PATENT DOCUMENTS

| | | | |
|---|---|---|---|
| 4,507,759 A | 3/1985 | Yasui et al. | |
| 5,311,115 A | 5/1994 | Archer | |
| 5,828,429 A | 10/1998 | Takemura | |
| 5,898,235 A | 4/1999 | McClure | |
| 5,986,463 A | 11/1999 | Takiguchi | |
| 6,091,203 A | 7/2000 | Kawashima et al. | |
| 6,246,180 B1 | 6/2001 | Nishigaki | |
| 6,452,153 B1 * | 9/2002 | Lauxtermann et al. | 250/208.1 |
| 6,515,310 B2 | 2/2003 | Yamazaki et al. | |
| 6,693,301 B2 | 2/2004 | Takemura | |
| 6,707,068 B2 | 3/2004 | Fujimoto et al. | |
| 6,734,836 B2 | 5/2004 | Nishitoba | |
| 6,753,654 B2 | 6/2004 | Koyama | |
| 6,774,574 B1 | 8/2004 | Koyama | |
| 6,777,887 B2 | 8/2004 | Koyama | |
| 6,787,807 B2 | 9/2004 | Yamazaki et al. | |
| 6,828,587 B2 | 12/2004 | Yamazaki et al. | |
| 6,872,604 B2 | 3/2005 | Yamazaki et al. | |
| 6,879,110 B2 | 4/2005 | Koyama | |

(Continued)

FOREIGN PATENT DOCUMENTS

| EP | 0561469 A2 | 9/1993 |
|---|---|---|
| EP | 0810732 A2 | 12/1997 |

(Continued)

*Primary Examiner* — Binh V Ho
(74) *Attorney, Agent, or Firm* — Fish & Richardson P.C.

(57) ABSTRACT

A light emitting device and an element substrate which are capable of suppressing variations in the luminance intensity of a light emitting element among pixels due to characteristic variations of a driving transistor without suppressing off-current of a switching transistor low and increasing storage capacity of a capacitor. According to the invention, a depletion mode transistor is used as a driving transistor. The gate of the driving transistor is fixed in its potential or connected to the source or drain thereof to operate in a saturation region with a constant current flow. A current controlling transistor which operates in a linear region is connected in series to the driving transistor, and a video signal for transmitting a light emission or non-emission of a pixel is inputted to the gate of the current controlling transistor through a switching transistor.

34 Claims, 12 Drawing Sheets

U.S. PATENT DOCUMENTS

| | | | |
|---|---|---|---|
| 6,900,861 B2 * | 5/2005 | Yasui | 349/110 |
| 6,933,533 B2 | 8/2005 | Yamazaki et al. | |
| 6,953,951 B2 | 10/2005 | Yamazaki et al. | |
| 7,158,104 B2 | 1/2007 | Koyama | |
| 7,242,376 B2 | 7/2007 | Yamashita et al. | |
| 7,336,035 B2 | 2/2008 | Koyama | |
| 7,358,531 B2 | 4/2008 | Koyama | |
| 7,429,985 B2 | 9/2008 | Kimura et al. | |
| 7,445,946 B2 | 11/2008 | Yamazaki et al. | |
| 7,456,810 B2 | 11/2008 | Kimura | |
| 7,719,498 B2 | 5/2010 | Koyama | |
| 2002/0101394 A1 | 8/2002 | Anzai | |
| 2002/0145582 A1 | 10/2002 | Yamazaki et al. | |
| 2002/0196212 A1 | 12/2002 | Nishitoba et al. | |
| 2003/0045043 A1 | 3/2003 | Koyama | |
| 2003/0058687 A1 | 3/2003 | Kimura | |
| 2003/0112352 A1 * | 6/2003 | Tanaka | 348/308 |
| 2003/0222589 A1 | 12/2003 | Osame et al. | |
| 2003/0234392 A1 * | 12/2003 | Kung et al. | 257/13 |
| 2004/0188761 A1 | 9/2004 | Koyama | |
| 2004/0189214 A1 * | 9/2004 | Osame et al. | 315/169.3 |
| 2004/0263741 A1 | 12/2004 | Koyama et al. | |
| 2007/0085783 A1 | 4/2007 | Koyama | |
| 2008/0001193 A1 * | 1/2008 | Hagihara et al. | 257/292 |
| 2008/0265786 A1 | 10/2008 | Koyama | |
| 2009/0072757 A1 | 3/2009 | Yamazaki et al. | |

FOREIGN PATENT DOCUMENTS

| | | |
|---|---|---|
| EP | 1063630 A2 | 12/2000 |
| JP | 02-041113 B | 9/1990 |
| JP | 06-013820 A | 1/1994 |
| JP | 06-216727 A | 8/1994 |
| JP | 08-115136 A | 5/1996 |
| JP | 09-168119 A | 6/1997 |
| JP | 09-321596 A | 12/1997 |
| JP | 10-214487 A | 8/1998 |
| JP | 11-282419 A | 10/1999 |
| JP | 2000-221942 A | 8/2000 |
| JP | 2000-252426 A | 9/2000 |
| JP | 2001-005426 A | 1/2001 |
| JP | 2002-108285 A | 4/2002 |
| JP | 2002-124377 A | 4/2002 |
| JP | 2002-333862 A | 11/2002 |
| JP | 2003-059650 A | 2/2003 |
| JP | 2003-295793 A | 10/2003 |
| JP | 2003-323154 A | 11/2003 |
| JP | 2004-333594 A | 11/2004 |

\* cited by examiner

ELEMENT SUBSTRATE AND LIGHT EMITTING DEVICE

CROSS-REFERENCE TO RELATED APPLICATIONS

This application is a continuation of U.S. application Ser. No. 13/184,616, filed Jul. 18, 2011, now allowed, which is a continuation of U.S. application Ser. No. 11/562,626, filed Nov. 22, 2006, now U.S. Pat. No. 8,004,200, which is a divisional of U.S. application Ser. No. 10/799,857, filed Mar. 15, 2004, now U.S. Pat. No. 7,141,934, which claims the benefit of foreign priority applications filed in Japan as Serial No. 2003-086496 on Mar. 26, 2003, and Serial No. 2003-139554 on May 16, 2003, all of which are incorporated by reference.

BACKGROUND OF THE INVENTION

1. Field of the Invention

The present invention relates to a light emitting device comprising a plurality of pixels each having a light emitting element and a means for supplying current to the light emitting element.

2. Description of the Related Art

Since a light emitting element emits light by itself, it is highly visible and does not require a back light which is needed in a liquid crystal display device (LCD). Therefore, it is suitably applied to thin devices and not restricted in viewing angle. Because of these advantages, a light emitting device having a light emitting element has recently been drawing attentions as an alternative display device to a CRT and an LCD. It is to be noted that a light emitting element in this specification indicates an element whose luminance is controlled by current or voltage, and it includes an OLED (Organic Light Emitting Diode) or an MIM electron source element (electron discharge element) and the like which is used in an FED (Field Emission Display).

Also, a light emitting device of the invention includes a panel and a module obtained by mounting an IC or the like onto the panel. More generally, the invention relates to an element substrate which corresponds to the one before the completion of a panel in manufacturing steps of the light emitting device, and the element substrate comprises a plurality of pixels each having a means for supplying current to a light emitting element.

OLED which is one of the light emitting elements includes an anode layer, a cathode layer, and a layer containing an electric field light emitting material (hereinafter referred to as an electroluminescent layer) that generates luminescence (electroluminescence) when an electric field is applied thereto. The electroluminescent layer is provided between an anode and cathode, and it comprises a single or multiple layers. These layers may contain an inorganic compound. The electroluminescence in the electroluminescent layer includes a light emission (fluorescence) when a singlet exciting state returns to a ground state and a light emission (phosphorescence) when a triplet exciting state returns to a ground state.

Next, the configuration of a pixel of a general light emitting device and its drive will be described in brief. A pixel shown in FIG. 9 comprises a switching transistor 900, a driving transistor 901, a capacitor 902, and a light emitting element 903. The gate of the switching transistor 900 is connected to a scan line 905. Either the source or drain of the switching transistor 900 is connected to a signal line 904, and the other is connected to the gate of the driving transistor 901. The source of the driving transistor 901 is connected to a power supply line 906, and the drain of the driving transistor 901 is connected to the anode of the light emitting element 903. The cathode of the light emitting element 903 is connected to a counter electrode 907. The capacitor 902 is provided for storing a potential difference between the gate and source of the driving transistor 901. Also, the predetermined voltages are applied to the power supply line 906 and the counter electrode 907 from a power supply and each has a potential difference.

When the switching transistor 900 is turned ON by a signal from the scan line 905, a video signal that is inputted to the signal line 904 is inputted to the gate of the driving transistor 901. The potential difference between a potential of the inputted video signal and that of the power supply line 906 corresponds to a gate-source voltage Vgs of the driving transistor 901. Thus, current is supplied to the light emitting element 903, and the light emitting element 903 emits light by using the supplied current.

SUMMARY OF THE INVENTION

A transistor using polysilicon has high field effect mobility and large on-current. Therefore, it is suited for a light emitting device. However, the transistor using polysilicon has problems in that it is likely to have variations in characteristics due to a defect in a crystal grain boundary.

In the pixel shown in FIG. 9, when the magnitude of the drain current of the driving transistor 901 differs among pixels, the luminance intensity of the light emitting element 903 varies even with the same potential of a video signal.

As a means for controlling variations in drain current, there is a method for enlarging an L/W (L: channel length, W: channel width) of the driving transistor 901 as disclosed in Japanese Patent Application No. 2003-008719. The drain current Ids of the driving transistor 901 in a saturation region is expressed by the following formula 1.

$$Ids = â(Vgs - Vth)^2/2 \qquad \text{(formula 1)}$$

It is apparent from the formula 1 that, the drain current Ids in the saturation region of the driving transistor 901 is easily fluctuated even by small variations in the gate-source voltage Vgs. Therefore, it is necessary to keep the gate-source voltage Vgs, which is stored between the gate and source of the driving transistor 901, not to be varied while the light emitting element 901 emits light. Thus, storage capacity of the capacitor 902 which is disposed between the gate and source of the driving transistor 901 is required to be increased, and off-current of the switching transistor 900 is required to be suppressed low.

It is quite difficult to suppress off-current of the switching transistor 900 low, to increase on-current thereof for charging large capacitance, and to achieve both of them in the formation process of the transistor.

Also, there is another problem that the gate-source voltage Vgs of the driving transistor 901 is varied due to the switching of the switching transistor 900, and potential changes in the signal line, scan line, and the like. This derives from the parasitic capacitance on the gate of the driving transistor 901.

In view of the foregoing problems, the invention provides a light emitting device and an element substrate which are not easily influenced by parasitic capacitance and capable of suppressing variations in luminance intensity of the light emitting element 903 among pixels due to characteristic variations of the driving transistor 901 without suppressing off-current of the switching transistor 900 low and increasing storage capacity of the capacitor 902.

According to the invention, a depletion mode transistor is used as a driving transistor. The gate of the driving transistor is fixed in its potential or connected to the source or drain thereof to operate in a saturation region with a constant current flow. Also, a current controlling transistor which operates in a linear region is connected in series to the driving transistor. A video signal for transmitting a light emission or non-emission of a pixel is inputted to the gate of the current controlling transistor through a switching transistor.

Transistors other than the driving transistor are normal enhancement mode transistors here.

Since the current controlling transistor operates in a linear region, its source-drain voltage Vds is small, and small changes in a gate-source voltage Vgs of the current controlling transistor do not influence the current flowing in a light emitting element. Current flowing in the light emitting element is determined by the driving transistor which operates in a saturation region.

Current flowing in the light emitting element is not influenced even without increasing storage capacity of a capacitor which is disposed between the gate and source of the current controlling transistor or suppressing off-current of the switching transistor low. In addition, it is not influenced by the parasitic capacitance on the gate of the current controlling transistor either. Therefore, cause of variation is decreased, and image quality is thus enhanced to a great extent.

In addition, as there is no need to suppress off-current of the switching transistor low, manufacturing process of the transistor can be simplified, thus contributes greatly to the cost reduction and improvement in yield.

DETAILED DESCRIPTION OF THE PREFERRED EMBODIMENTS

Embodiment modes of the invention are described in detail with reference to the accompanying drawings below.

Embodiment Mode 1

Figure 1:
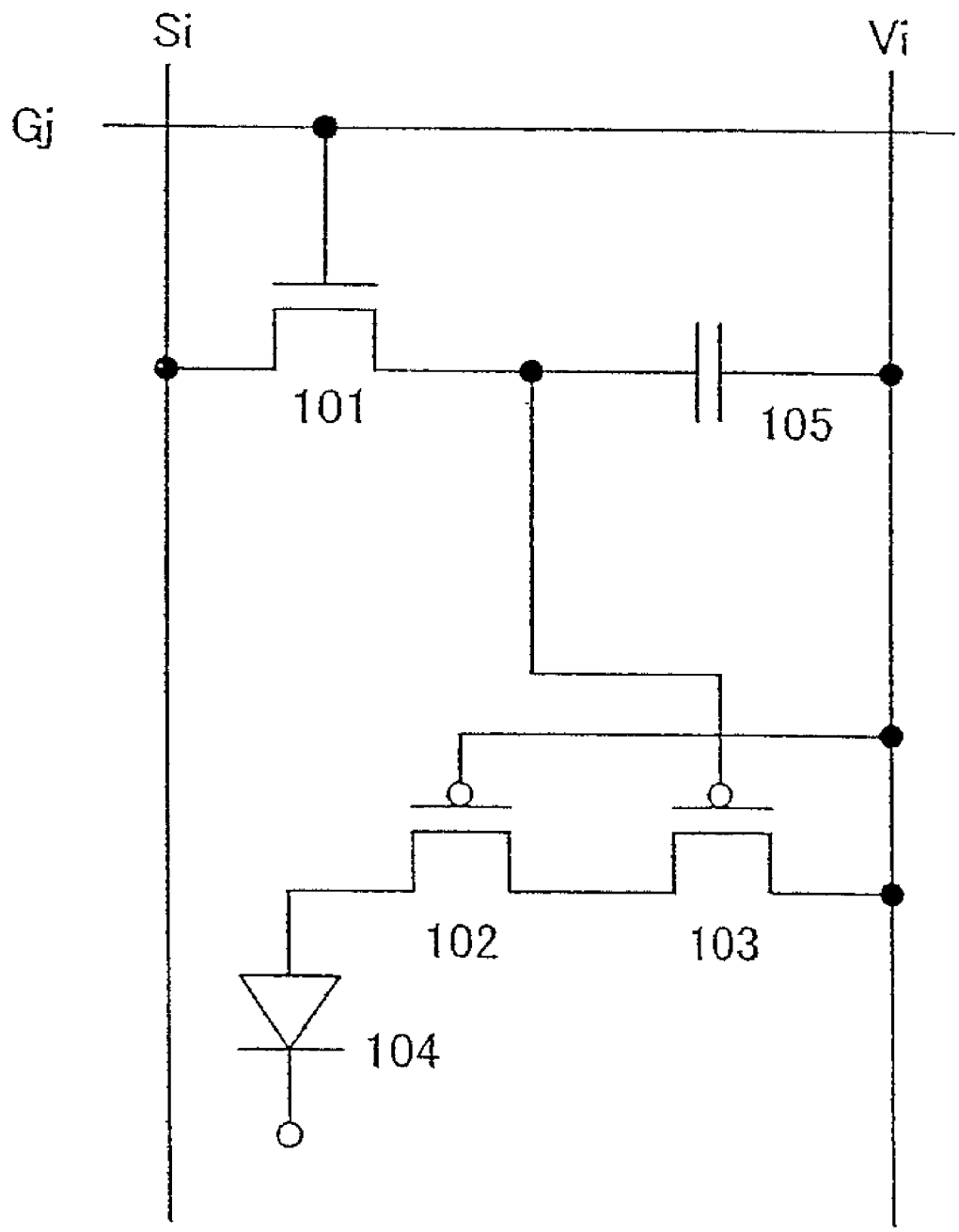
FIG. 1 is a diagram showing an embodiment mode of the invention.

FIG. 1 shows an embodiment mode of a pixel of the light emitting device of the invention. The pixel shown in FIG. 1 comprises a light emitting element 104, a transistor (switching transistor) 101 used as a switching element for controlling an input of a video signal to the pixel, a driving transistor 102 for controlling current flowing in the light emitting element 104, and a current controlling transistor 103 for controlling a current supply to the light emitting element 104. In addition, it is also possible to dispose in the pixel a capacitor 105 for storing a potential of a video signal.

The driving transistor 102 and the current controlling transistor 103 have the same conductivity. It is assumed that the driving transistor 102 is a depletion mode transistor, and the rest of the transistors are normal enhancement mode transistors. In the invention, the driving transistor 102 is operated in a saturation region and the current controlling transistor 103 is operated in a linear region.

The channel length (L) of the driving transistor 102 may be longer than its channel width (W), and L of the current controlling transistor 103 may be equal to or shorter than its W. Desirably, the ratio of L to W (L/W) of the driving transistor 102 is five or more.

The gate of the switching transistor 101 is connected to a scan line Gj (j=1 to y). Either the source or drain of the switching transistor 101 is connected to a signal line Si (i=1 to x), and the other is connected to the gate of the current controlling transistor 103. The gate of the driving transistor 102 is connected to a power supply line Vi (i=1 to x). The driving transistor 102 and the current controlling transistor 103 are each connected to the power supply line Vi (i=1 to x) and the light emitting element 104 so that a current supplied from the power supply line Vi (i=1 to x) is supplied to the light emitting element 104 as a drain current of the driving transistor 102 and of the current controlling transistor 103. In this embodiment mode, the source of the current controlling transistor 103 is connected to the power supply line Vi (i=1 to x) and the drain of the driving transistor 102 is connected to a pixel electrode of the light emitting element 104.

It is to be noted that the source of the driving transistor 102 may be connected to the power supply line Vi (i=1 to x), and the drain of the current controlling transistor 103 may be connected to the pixel electrode of the light emitting element 104.

The light emitting element 104 comprises an anode, a cathode, and a light emitting layer interposed between the anode and cathode. As shown in FIG. 1, when the anode of the light emitting element 104 is connected to the driving transistor 102, the anode is a pixel electrode and the cathode is a counter electrode. The counter electrode of the light emitting element 104 and the power supply line Vi (i=1 to x) are made to have a potential difference so that current flows into the light emitting element 104 in the forward bias direction.

One of the two electrodes of the capacitor 105 is connected to the power supply line Vi (i=1 to x), and the other is connected to the gate of the current controlling transistor 103. The capacitor 105 is disposed so as to store a potential difference between the two electrodes of the capacitor 105 when the switching transistor 101 is not selected (off state). It is to be noted that although FIG. 1 shows a configuration disposing the capacitor 105, the invention is not limited to this and an alternative configuration without the capacitor 105 may be employed as well.

In FIG. 1, each of the driving transistor 102 and the current controlling transistor 103 is a P-type transistor, and the drain of the driving transistor 102 is connected to the anode of the light emitting element 104. On the contrary, in the case where each of the driving transistor 102 and the current controlling transistor 103 is an N-type transistor, the source of the driving transistor 102 is connected to the cathode of the light emitting element 104. In this case, the cathode of the light emitting element 104 is a pixel electrode and the anode thereof is a counter electrode.

Next, a driving method of the pixel shown in FIG. 1 is described. The operation of the pixel shown in FIG. 1 can be divided into a writing period and a data storage period. First, in the writing period, when the scan line Gj (j=1 to y) is selected, the switching transistor 101 whose gate is connected to the scan line Gj (j=1 to y) is turned ON. Then, a video signal which is inputted to the signal line Si (i=1 to x) is inputted to the gate of the current controlling transistor 103 through the switching transistor 101. The driving transistor 102 is ON at all times as its gate is connected to the power supply line Vi (i=1 to x).

When the current controlling transistor 103 is turned ON by a video signal, current is supplied to the light emitting element 104 through the current supply line Vi (i=1 to x). At this time, the current controlling transistor 103 operates in a linear region, thus current flowing in the light emitting element 104 is determined by volt-ampere characteristics of the driving transistor 102 operating in a saturation region and the light emitting element 104. The light emitting element 104 emits light at luminance corresponding to the magnitude of the supplied current.

Meanwhile, when the current controlling transistor 103 is turned OFF by a video signal, no current is supplied to the light emitting element 104, thus it does not emit light. It is to be noted that according to the invention, it is possible to control current not to be supplied to the light emitting element 104 even when the driving transistor 102 is a depletion mode transistor since the current controlling transistor 103 is an enhancement mode transistor.

In the data storage period, the switching transistor 101 is turned OFF by controlling a potential of the scan line Gj (j=1 to y), thereby storing a potential of the video signal that is written in the writing period. In the writing period, when the current controlling transistor 103 is turned ON, a potential of a video signal is stored in the capacitor 105, therefore, the current supply to the light emitting element 104 is kept on. On the contrary, when the current controlling transistor 103 is turned OFF in the writing period, a potential of a video signal is stored in the capacitor 105, therefore, current is not supplied to the light emitting element 104.

An element substrate of the invention corresponds to the one before the formation of a light emitting element in manufacturing steps of the light emitting device of the invention.

A transistor used in the light emitting device of the invention may be a transistor formed by using single crystalline silicon or an SOI, a thin film transistor using polycrystalline silicon or amorphous silicon, or a transistor using an organic semiconductor or a carbon nanotube. In addition, a transistor disposed in a pixel of the light emitting device of the invention may be a single gate transistor, a double gate transistor, or a multi-gate transistor having more than two gate electrodes.

According to the above-described configuration, a source-drain voltage Vds of the current controlling transistor 103 is small as the current controlling transistor 103 operates in a linear region, therefore, small changes in the gate-source voltage Vgs of the current controlling transistor 103 do not influence the current flowing in a light emitting element 104. Current flowing in the light emitting element 104 is determined by the driving transistor 102 which operates in a saturation region. Current flowing in the light emitting element 104 is not influenced even without increasing storage capacity of the capacitor 105 which is disposed between the gate and source of the current controlling transistor 103 or suppressing off-current of the switching transistor 101 low. In addition, it is not influenced by the parasitic capacitance on the gate of the current controlling transistor 103 either. Therefore, cause of variation is decreased, and image quality is thus enhanced to a great extent.

Embodiment Mode 2

Described in this embodiment mode is a different configuration of a pixel of the light emitting device from that shown in FIG. 1.

Figure 2:
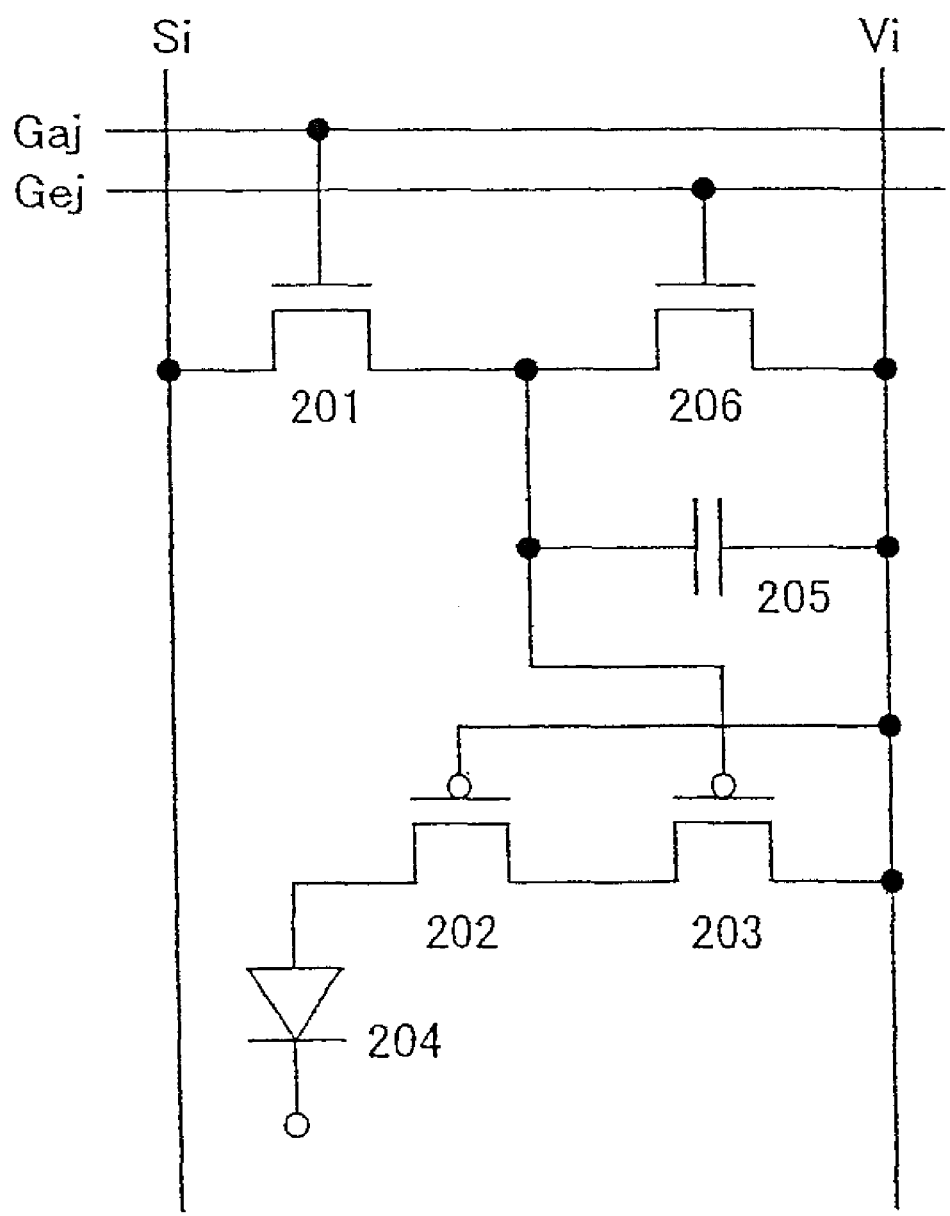
FIG. 2 is a diagram showing an embodiment mode of the invention.

The pixel shown in FIG. 2 comprises a light emitting element 204, a switching transistor 201, a driving transistor 202, a current controlling transistor 203, and a transistor (erasing transistor) 206 for turning OFF the current controlling transistor 203 forcibly. In addition, it is also possible to dispose a capacitor 205 in addition to the aforementioned elements.

The driving transistor 202 and the current controlling transistor 203 have the same conductivity. The size, characteristics, and operating region of each transistor may be set in the same manner as Embodiment Mode 1.

The gate of the switching transistor 201 is connected to a first scan line Gaj (j=1 to y). Either the source or drain of the switching transistor 201 is connected to a signal line Si (i=1 to x), and the other is connected to the gate of the current controlling transistor 203. The gate of the erasing transistor 206 is connected to a second scan line Gej (j=1 to y). Either the source or drain of the erasing transistor 206 is connected to a power supply line Vi (i=1 to x), and the other is connected to the gate of the current controlling transistor 203. The gate of the driving transistor 202 is connected to the power supply line Vi (i=1 to x). The driving transistor 202 and the current controlling transistor 203 are each connected to the power supply line Vi (i=1 to x) and the light emitting element 204 so that a current supplied from the power supply line Vi (i=1 to x) is supplied to the light emitting element 204 as a drain current of the driving transistor 202 and of the current controlling transistor 203. In this embodiment mode, the source of the current controlling transistor 203 is connected to the power supply line Vi (i=1 to x) and the drain of the driving transistor 202 is connected to a pixel electrode of the light emitting element 204.

It is to be noted that the source of the driving transistor 202 may be connected to the power supply line Vi (i=1 to x), and the drain of the current controlling transistor 203 may be connected to the pixel electrode of the light emitting element 204.

The light emitting element 204 comprises an anode, a cathode, and a light emitting layer interposed between the anode and cathode. As shown in FIG. 2, when the anode of the light emitting element 204 is connected to the driving transistor 202, the anode is a pixel electrode and the cathode is a counter electrode. The counter electrode of the light emitting element 204 and the power supply line Vi (i=1 to x) have a potential difference so that current flows into the light emitting element 204 in the forward bias direction.

One of the two electrodes of the capacitor 205 is connected to the power supply line Vi (i=1 to x), and the other is connected to the gate of the current controlling transistor 203.

In FIG. 2, each of the driving transistor 202 and the current controlling transistor 203 is a P-type transistor, and the drain of the driving transistor 202 is connected to the anode of the light emitting element 204. On the contrary, in the case where each of the driving transistor 202 and the current controlling transistor 203 is an N-type transistor, the source of the driving transistor 202 is connected to the cathode of the light emitting element 204. In this case, the cathode of the light emitting element 204 is a pixel electrode and the anode thereof is a counter electrode.

The operation of the pixel shown in FIG. 2 can be divided into a writing period, a data storage period, and an erasing period. The operations of the switching transistor 201, the driving transistor 202, and the current controlling transistor 203 in writing period and data storage period are the same as those in FIG. 1.

In erasing period, the second scan line Gej (j=1 to y) is selected to turn ON the erasing transistor 206, thus a potential of the power supply line Vi (i=1 to x) is supplied to the gate of the current controlling transistor 203 through the erasing transistor 206. Therefore, the current controlling transistor 203 is turned OFF, and the light emitting element 204 can be forcibly brought into the state where no current is supplied.

Embodiment Mode 3

Described in this embodiment mode is a different configuration of a pixel of the light emitting device of the invention from those of Embodiment Modes 1 and 2.

Figure 3:
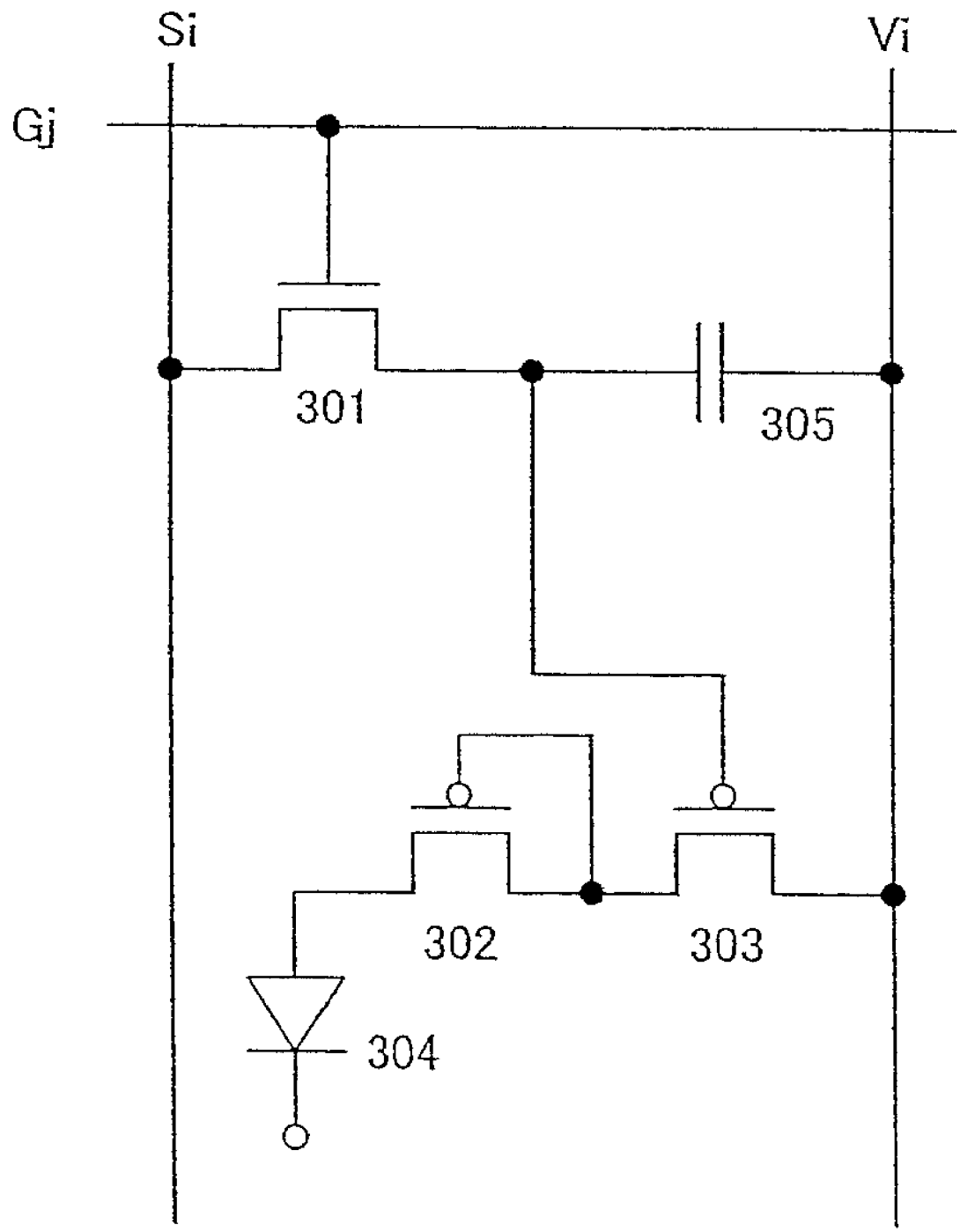
FIG. 3 is a diagram showing an embodiment mode of the invention.

The pixel shown in FIG. 3 comprises a light emitting element 304, a transistor (switching transistor) 301 used as a switching element for controlling input of a video signal to the pixel, a driving transistor 302 for controlling a current flowing into the light emitting element 304, a current controlling transistor 303 for controlling a current supply to the light emitting element 304. In addition, it is also possible to dispose a capacitor 305 for storing a potential of a video signal as shown in the figure.

The driving transistor 302 and the current controlling transistor 303 have the same conductivity. The size, characteristics, and operating region of each transistor may be set in the same manner as those of Embodiment Mode 1.

The gate of the switching transistor 301 is connected to a scan line Gj (j=1 to y). Either the source or drain of the switching transistor 301 is connected to a signal line Si (i=1 to x), and the other is connected to the gate of the current controlling transistor 303. The gate of the driving transistor 302 is connected to the source thereof. The driving transistor 302 and the current controlling transistor 303 are each connected to a power supply line Vi (i=1 to x) and the light emitting element 304 so that a current supplied from the power supply line Vi (i=1 to x) is supplied to the light emitting element 304 as a drain current of the driving transistor 302 and of the current controlling transistor 303. In this embodiment mode, the source of the current controlling transistor 303 is connected to the power supply line Vi (i=1 to x) and the drain of the driving transistor 302 is connected to a pixel electrode of the light emitting element 304.

It is to be noted that the source and gate of the driving transistor 302 may be connected to the power supply line Vi (i=1 to x), and the drain of the current controlling transistor 303 may be connected to the pixel electrode of the light emitting element 304.

The light emitting element 304 comprises an anode, a cathode, and a light emitting layer interposed between the anode and cathode. As shown in FIG. 3, when the anode of the light emitting element 304 is connected to the driving transistor 302, the anode is a pixel electrode and the cathode is a counter electrode. The counter electrode of the light emitting element 304 and the power supply line Vi (i=1 to x) have a potential difference so that current flows into the light emitting element 304 in the forward bias direction.

One of the two electrodes of the capacitor 305 is connected to the power supply line Vi (i=1 to x), and the other is connected to the gate of the current controlling transistor 303. The capacitor 305 is disposed so as to store a potential difference between the two electrodes of the capacitor 305 when the switching transistor 301 is not selected (off state). It is to be noted that although FIG. 3 shows a configuration disposing the capacitor 305, the invention is not limited to this and an alternative configuration without the capacitor 305 may be employed as well.

In FIG. 3, each of the driving transistor 302 and the current controlling transistor 303 is a P-type transistor, and the drain of the driving transistor 302 is connected to the anode of the light emitting element 304. On the contrary, in the case where each of the driving transistor 302 and the current controlling transistor 303 is an N-type transistor, the source of the driving transistor 302 is connected to the cathode of the light emitting element 304. In this case, the cathode of the light emitting element 304 is a pixel electrode and the anode thereof is a counter electrode.

The operation of the pixel shown in FIG. 3 is the same as that shown in FIG. 1.

Embodiment Mode 4

Described in this embodiment mode is a different configuration of a pixel of the light emitting device of the invention from those of Embodiment Modes 1 to 3.

Figure 4:
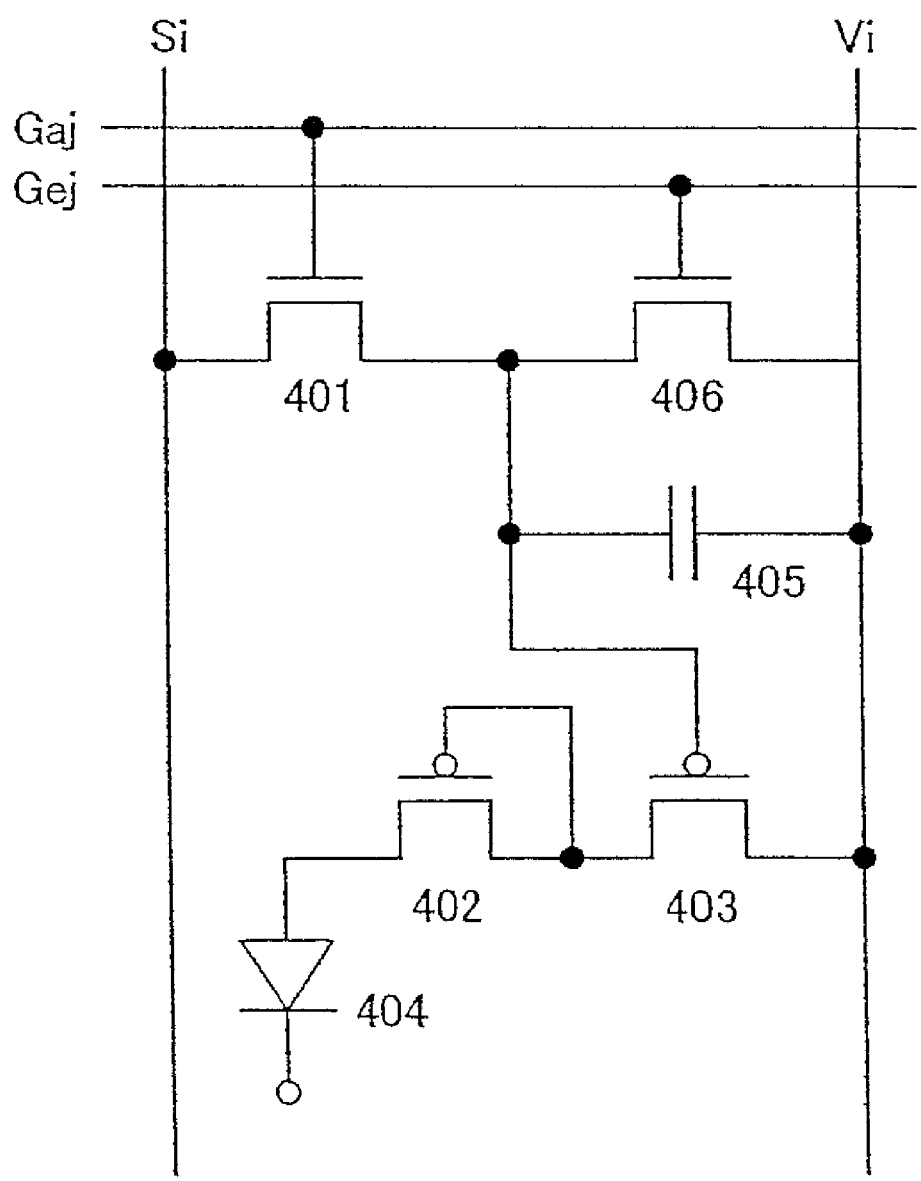
FIG. 4 is a diagram showing an embodiment mode of the invention.

The pixel shown in FIG. 4 comprises a light emitting element 404, a switching transistor 401, a driving transistor 402, a current controlling transistor 403, and a transistor (erasing transistor) 406 for erasing a potential of a written video signal. It is also possible to dispose a capacitor 405 in addition to the above elements.

The driving transistor 402 and the current controlling transistor 403 have the same conductivity. The size, characteristics, and operating region of each transistor may be set in the same manner as those of Embodiment Mode 1.

The gate of the switching transistor 401 is connected to a first scan line Gaj (j=1 to y). Either the source or drain of the switching transistor 401 is connected to a signal line Si (i=1 to x), and the other is connected to the gate of the current controlling transistor 403. The gate of the erasing transistor 406 is connected to a second scan line Gej (j=1 to y). Either the source or drain of the erasing transistor 406 is connected to a second scan line Gej (i=1 to x), and the other is connected to the gate of the current controlling transistor 403. The gate of the driving transistor 402 is connected to the source thereof. The driving transistor 402 and the current controlling transistor 403 are each connected to a power supply line Vi (i=1 to x) and the light emitting element 404 so that a current supplied from the power supply line Vi (i=1 to x) is supplied to the light emitting element 404 as a drain current of the driving transistor 402 and of the current controlling transistor 403. In this embodiment mode, the source of the current controlling transistor 403 is connected to the power supply line Vi (i=1 to x) and the drain of the driving transistor 402 is connected to a pixel electrode of the light emitting element 404.

It is to be noted that the source of the driving transistor 402 may be connected to the power supply line Vi (i=1 to x), and the drain of the current controlling transistor 403 may be connected to the pixel electrode of the light emitting element 404.

The light emitting element 404 comprises an anode, a cathode, and a light emitting layer interposed between the anode and cathode. As shown in FIG. 4, when the anode of the light emitting element 404 is connected to the driving transistor 402, the anode is a pixel electrode and the cathode is a counter electrode. The counter electrode of the light emitting element 404 and the power supply line Vi (i=1 to x) have a potential difference so that current flows into the light emitting element 404 in the forward bias direction.

One of the two electrodes of the capacitor 405 is connected to the power supply line Vi (i=1 to x), and the other is connected to the gate of the current controlling transistor 403.

In FIG. 4, each of the driving transistor 402 and the current controlling transistor 403 is a P-type transistor, and the drain of the driving transistor 402 is connected to the anode of the light emitting element 404. On the contrary, in the case where each of the driving transistor 402 and the current controlling transistor 403 is an N-type transistor, the source of the driving transistor 402 is connected to the cathode of the light emitting element 404. In this case, the cathode of the light emitting element 404 is a pixel electrode and the anode thereof is a counter electrode.

The operation of the pixel shown in FIG. 4 is the same as that shown in FIG. 2.

In addition, either an N-type transistor or a P-type transistor may be employed as a switching transistor and an erasing transistor used in the invention.

Embodiment 1

Described in this embodiment are a configuration of an active matrix display device to which the pixel configuration of the invention is applied and its drive.

Figure 5:
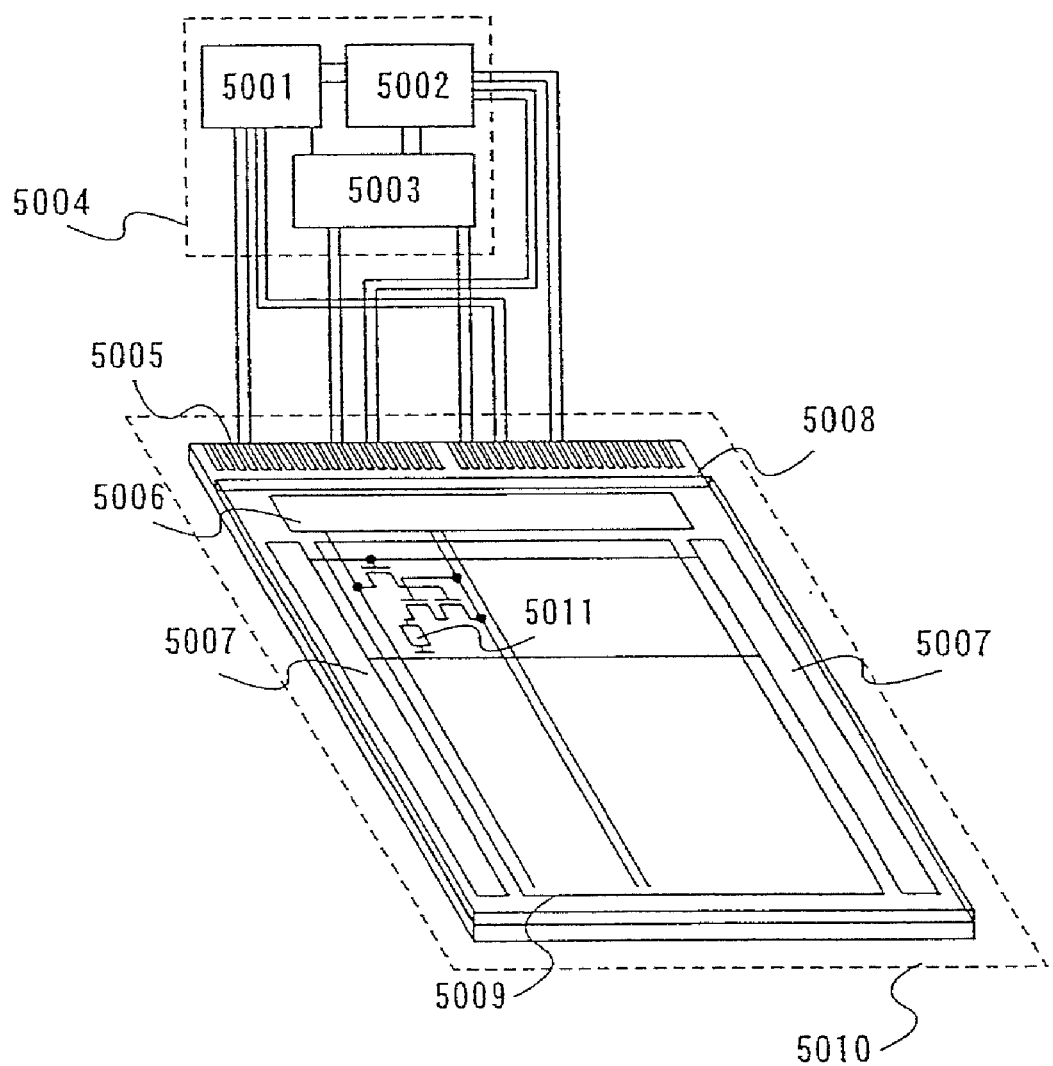
FIG. 5 is a schematic view showing an external circuit and a panel.

FIG. 5 shows a block diagram of an external circuit and a schematic view of a panel.

An active matrix display device shown in FIG. 5 comprises an external circuit 5004 and a panel 5010. The external circuit 5004 comprises an A/D converter unit 5001, a power supply unit 5002, and a signal generator unit 5003. The A/D converter unit 5001 converts an image data signal which is inputted as an analog signal into a digital signal (video signal), and supplies it to a signal driver circuit 5006. The power supply unit 5002 generates power having a predetermined voltage from the power supplied from a battery or an outlet, and supplies it to the signal driver circuit 5006, scan driver circuits 5007, an OLED 5011, the signal generator unit 5003, and the like. The signal generator unit 5003 is inputted with power, an image signal, a synchronizing signal, and the like. Also, it generates a clock signal and the like for driving the signal driver circuit 5006 and the scan driver circuits 5007.

A signal and power from the external circuit 5004 are inputted to an internal circuit and the like through an FPC and an FPC connection portion 5005 in the panel 5010.

The pixel 5010 comprises a substrate 5008 mounting the FPC connection portion 5005, the internal circuit, and the OLED 5011. The internal circuit comprises the signal driver circuit 5006, the scan driver circuits 5007, a pixel portion 5009. Although FIG. 5 employs the pixel shown in Embodiment Mode 1, an alternative pixel configuration shown in other embodiment modes of the invention may be employed as well.

The pixel portion 5009 is disposed in the center of the substrate, and the signal driver circuit 5006 and the scan driver circuit 5007 are disposed on the periphery of the pixel portion 5009. The OLED 5011 and a counter electrode of the OLED are formed over the pixel portion 5009.

Figure 6:
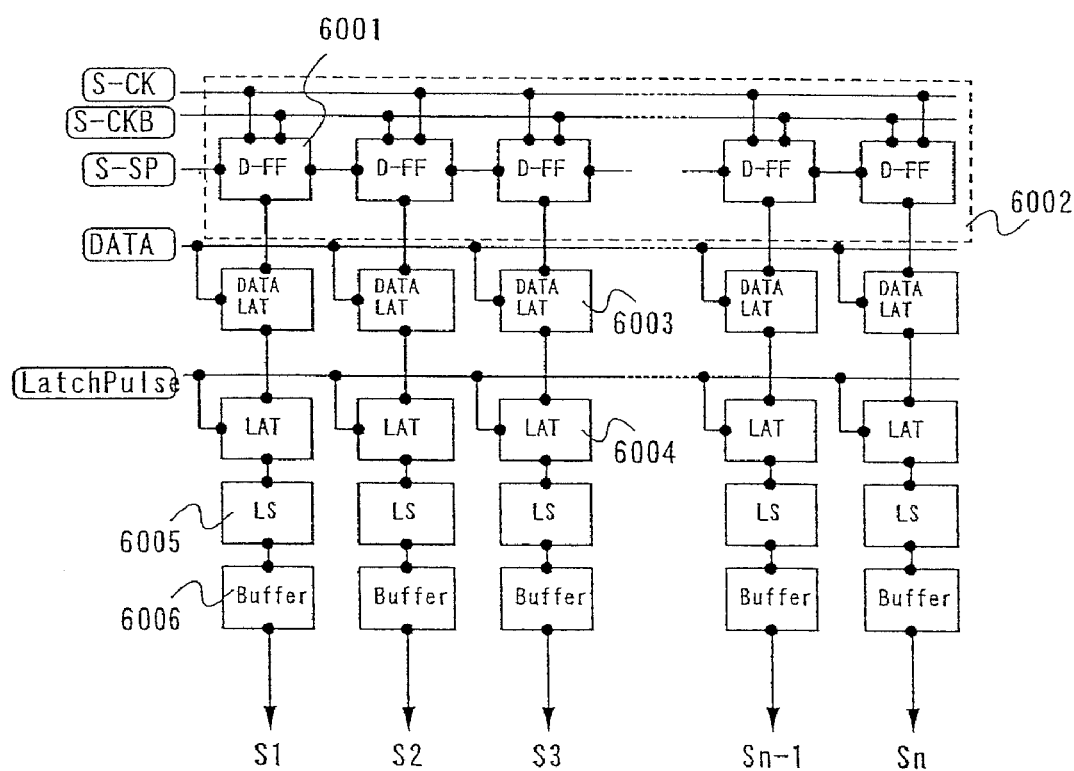
FIG. 6 is a diagram showing the configuration example of a signal driver circuit.

FIG. 6 shows a more detailed block diagram of the signal driver circuit 5006.

The signal driver circuit 5006 comprises a shift register 6002 including a plurality of stages of D-flip flops 6001, a data latch circuit 6003, a latch circuit 6004, a level shifter 6005, a buffer 6006, and the like.

It is assumed that a clock signal (S-CK), an inverted clock signal (S-CKB), a start pulse (S-SP), a video signal (DATA), and a latch pulse (LatchPulse) are inputted.

First, in accordance with a clock signal, an inverted clock signal, and a start pulse, a sampling pulse is sequentially outputted from the shift register 6002. In accordance with the timing in which the sampling pulse is inputted to the data latch circuit 6003, a video signal is sampled and thus stored. This operation is sequentially performed from the first column.

When the storage of a video signal is completed in the data latch circuit 6003 on the last stage, a latch pulse is inputted during a horizontal retrace period, and the video signal stored in the data latch circuit 6003 is transferred to the latch circuit 6004 all at once. Then, it is level-shifted in the level shifter 6005, and adjusted in the buffer 6006 so as to be outputted to signal lines S1 to Sn all at once. At this time, an H-level or an L-level signal is inputted to pixels in the row selected by the scan driver circuits 5007, thereby controlling a light emission or non-emission of the OLED 5011.

Although the active matrix display device shown in this embodiment comprises the panel 5010 and the external circuit 5004 each formed independently, they may be integrally formed on the same substrate. Also, although the display device employs OLED in this embodiment, other light emitting elements can be employed as well. In addition, the level shifter 6005 and the buffer 6006 may not necessarily be provided in the signal driver circuit 5006.

Embodiment 2

Figure 7:
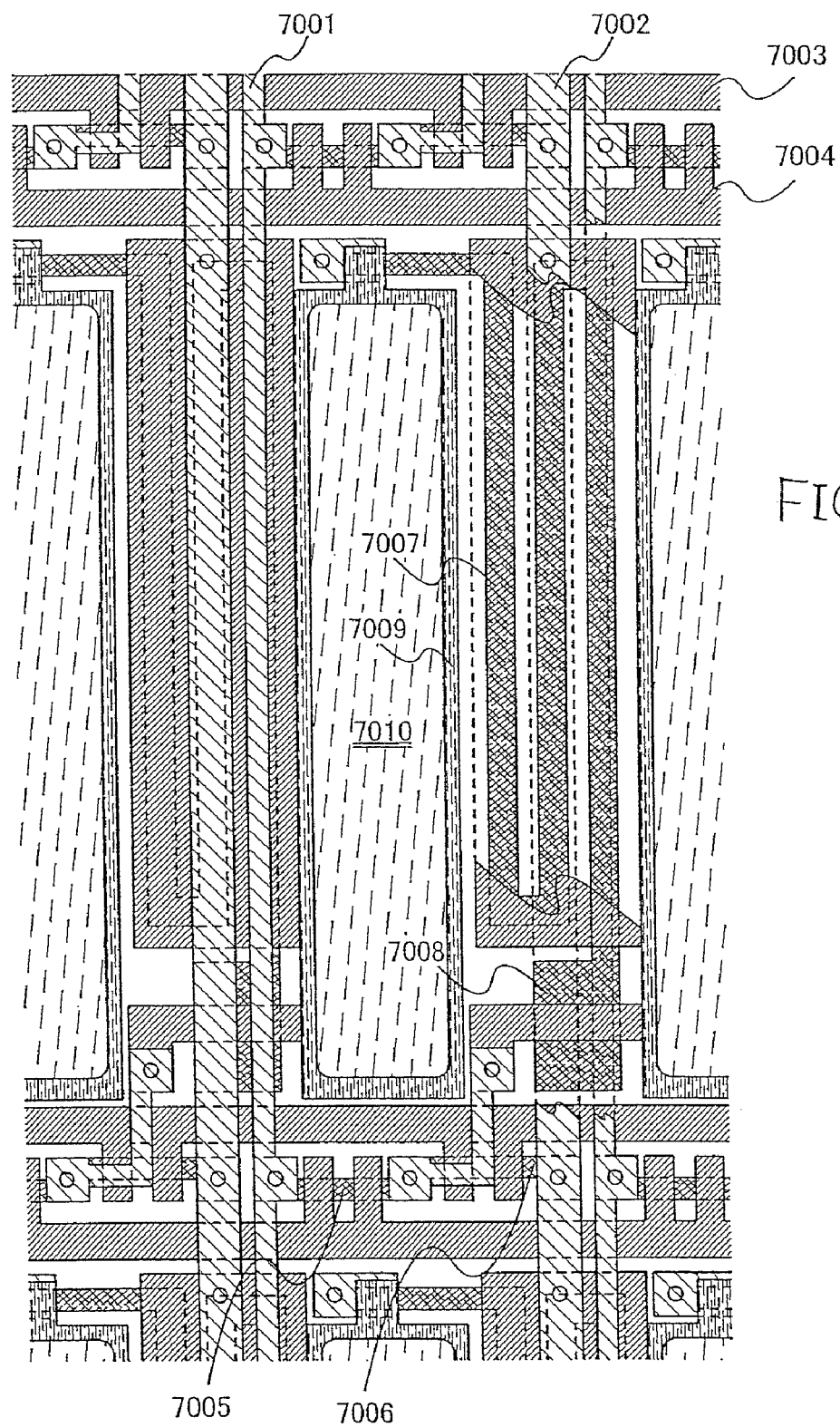
FIG. 7 is an example showing a top plan view of the invention.

Described in this embodiment is a top plan view of the pixel shown in FIG. 2. FIG. 7 shows a top plan view of a pixel of this embodiment.

Reference numeral 7001 denotes a signal line, 7002 denotes a power supply line, 7004 denotes a first scan line, and 7003 denotes a second scan line. In this embodiment, the signal line 7001 and the power supply line 7002 are formed of the same conductive film, and the first scan line 7004 and the second scan line 7003 are formed of the same conductive film. Reference numeral 7005 denotes a switching transistor, and a part of the first scan line 7004 functions as its gate electrode. Reference numeral 7006 denotes an erasing transistor, and a part of the second scan line 7003 functions as its gate electrode. Reference numeral 7007 denotes a driving transistor, and 7008 denotes a current controlling transistor. An active layer of the driving transistor 7007 is curved so that its L/W becomes larger than that of the current controlling transistor 7008. Reference numeral 7009 denotes a pixel electrode, and light is emitted in its overlapped area (light emitting area) 7010 with a light emitting layer and a cathode (neither of them is shown).

It is to be noted that the top plan view of the invention shown in this embodiment is only an example, and the invention is, needless to say, not limited to this.

Embodiment 3

Figure 10:
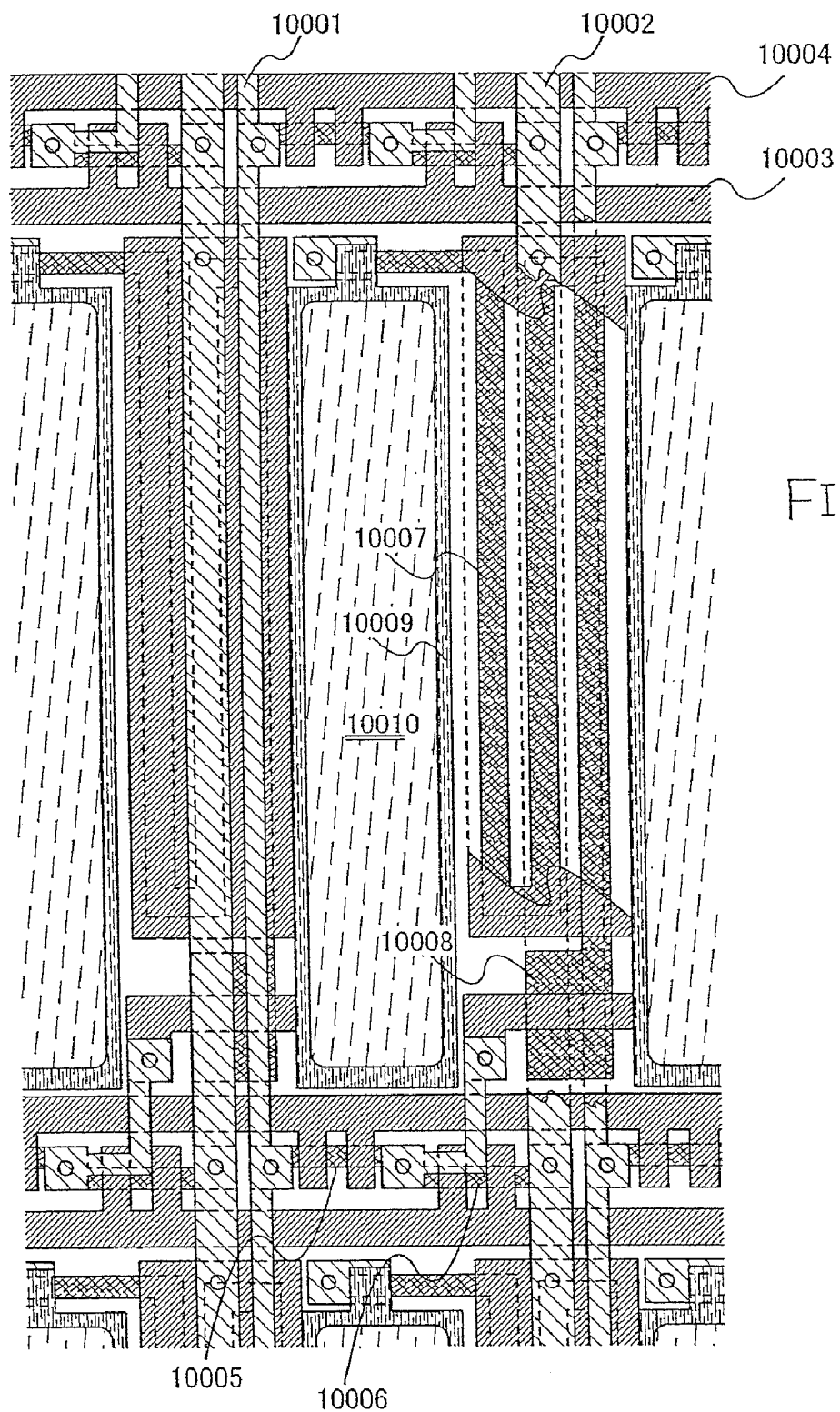
FIG. 10 is an example showing a top plan view of the invention.

Described in this embodiment is an example of a top plan view of the pixel shown in FIG. 2, which is different from that shown in FIG. 7. FIG. 10 shows a top plan view of a pixel of this embodiment.

Reference numeral 10001 denotes a signal line, 10002 denotes a power supply line, 10004 denotes a first scan line, and 10003 denotes a second scan line. In this embodiment, the signal line 10001 and the power supply line 10002 are formed of the same conductive film, and the first scan line 10004 and the second scan line 10003 are formed of the same conductive film. Reference numeral 10005 denotes a switching transistor, and a part of the first scan line 10004 functions as its gate electrode. Reference numeral 10006 denotes a erasing transistor, and a part of the second scan line 10003 functions as its gate electrode. Reference numeral 10007 denotes a driving transistor, and 10008 denotes a current controlling transistor. An active layer of the driving transistor 10007 is curved so that its L/W becomes larger than that of the current controlling transistor 10008. Reference numeral 10009 denotes a pixel electrode, and light is emitted in its overlapped area (light emitting area) 10010 with a light emitting layer and a cathode (neither of them is shown).

It is to be noted that the top plan view of this embodiment is only an example, and the invention is, needless to say, not limited to this.

Embodiment 4

Described in this embodiment is a cross-sectional structure of a pixel.

Figure 11A:
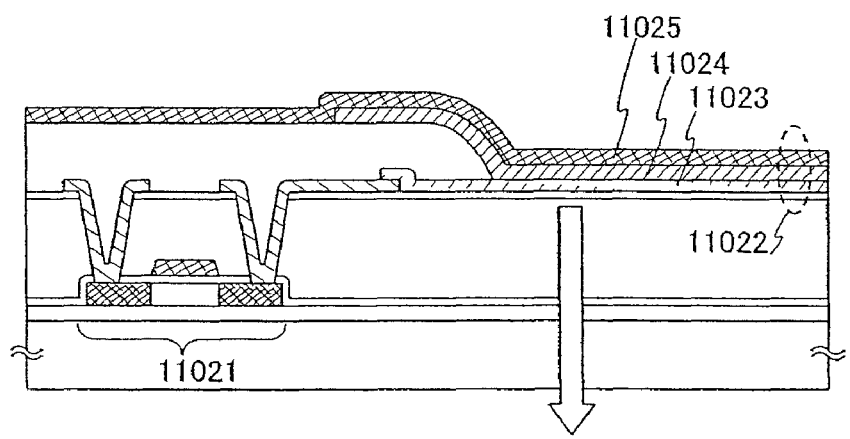
FIGS. 11A and 11B are examples showing cross-sectional structures of the invention.

FIG. 11A shows a cross-sectional view of a pixel in which a driving transistor 11021 is a P-type transistor and light emitted from a light emitting element 11022 is transmitted to an anode side 11023. In FIG. 11A, the anode 11023 of the light emitting element 11022 is electrically connected to the driving transistor 11021, and a light emitting layer 11024 and a cathode 11025 are laminated on the anode 11023 in this order. As for the cathode 11025, known material can be used as long as it is a conductive film having a small work function and reflecting light. For example, Ca, Al, CaF, MgAg, AlLi, and the like are desirably used. The light emitting layer 11024 may comprise a single layer or multiple layers. When it comprises multiple layers, a hole injection layer, a hole transporting layer, a light emitting layer, an electron transporting layer, and an electron injection layer are sequentially laminated in this order on the cathode 11023. It is to be noted that not all of the above layers are necessarily provided. The anode 11023 may be formed of a transparent conductive film which transmits light, such as the one comprising ITO or the one in which indium oxide is mixed with zinc oxide (ZnO) of 2 to 20%.

The overlapped portion of the anode 11023, the light emitting layer 11024, and the cathode 11025 corresponds to the light emitting element 11022. In the case of the pixel shown in FIG. 11A, light emitted from the light emitting element 11022 is transmitted to the anode 11023 side as shown by an outline arrow.

Figure 11B:
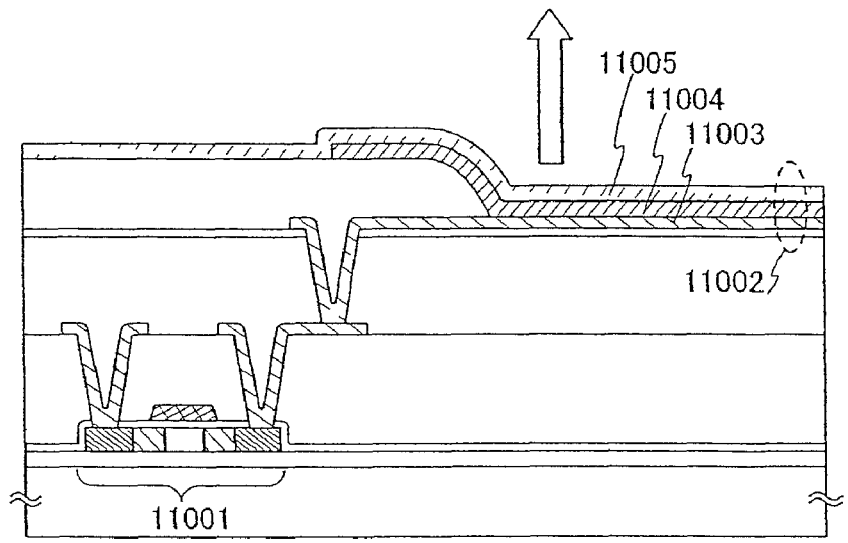

FIG. 11B shows a cross-sectional view of a pixel in which a driving transistor 11001 is an N-type transistor and light emitted from a light emitting element 11002 is transmitted to an anode side 11005. In FIG. 11B, a cathode 11003 of the light emitting element 11002 is electrically connected to the driving transistor 11001, and a light emitting layer 11004 and an anode 11005 are laminated on the cathode 11003 in this order. As for the cathode 11005, known material can be used as long as it is a conductive film having a small work function and reflecting light. For example, Ca, Al, CaF, MgAg, AlLi, and the like are desirably used. The light emitting layer 11004 may comprise a single layer or multiple layers. When it comprises multiple layers, a hole injection layer, a hole transporting layer, a light emitting layer, an electron transporting layer, and an electron injection layer are sequentially laminated in this order on the cathode 11003. It is to be noted that not all the above layers are necessarily provided. The anode 11005 may be formed of a transparent conductive film which transmits light, such as the one comprising ITO or the one in which indium oxide is mixed with zinc oxide (ZnO) of 2 to 20%.

The overlapped portion of the anode 11003, the light emitting layer 11004, and the cathode 11005 corresponds to the light emitting element 11002. In the case of the pixel shown in FIG. 11B, light emitted from the light emitting element 11002 is transmitted to the anode 11003 side as shown by an outline arrow.

It is to be noted that although shown in this embodiment is the one in which a driving transistor is electrically connected to a light emitting element, a current controlling transistor may be interposed between the driving transistor and the light emitting element.

Embodiment 5

Described in this embodiment is an example of the drive timing where the pixel configuration of Embodiment Mode 2 is employed.

Figure 12:
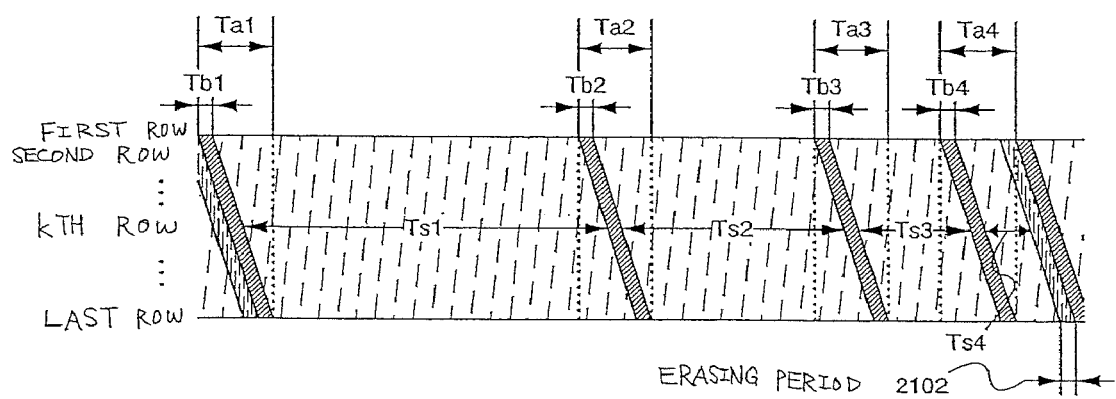
FIG. 12 is an example showing the operation timing of the invention.

FIG. 12A shows an example using a digital time gray scale method for a 4-bit gray scale display. In data storage periods Ts1 to Ts4, the ratio of the time length is assumed to be Ts1:Ts2:Ts3:Ts4=$2^3:2^2:2^1:2^0$=8:4:2:1.

The operation is described next. First, in a writing period Tb1, the first scan line is selected from the first row in sequence, thereby turning ON the switching transistor. Next, a video signal is inputted to each pixel from a signal line, thereby controlling a light emission or non-light emission of each pixel according to a potential of the signal. Once the video signal is written, that row proceeds to the data storage period Ts1 immediately. The same operation is performed up to the last row, and thus a period Ta1 terminates. Subsequently, a writing period Tb2 is started from the row in which the data storage period Ts1 is complete in sequence.

In the sub-frame period having the shorter data storage period than the writing period (corresponds to a period Ta4 here), an erasing period 2102 is provided so that a next writing period is not started immediately after the data storage period. In the erasing period, a light emitting element is forced to be in a non-emission state.

Taken as an example here is the case of expressing a 4-bit gray scale display, however the number of bits and gray scales is not limited to this. In addition, light emission is not necessarily performed from Ts1 to Ts4 in sequence. It may be performed at random, or divided into a plurality of periods.

Embodiment 6

The display device of the invention can be used in display portions of various electronic apparatuses. In particular, the display device of the invention is desirably applied to a mobile device that requires low power consumption.

Electronic apparatuses using the display device of the invention include a portable information device (a cellular phone, a mobile computer, a portable game machine, an electronic book, and the like), a video camera, a digital camera, a goggle display, a display device, a navigation system, and the like. Specific examples of these electronic apparatuses are shown in FIGS. 8A to 8D.

Figure 8A:
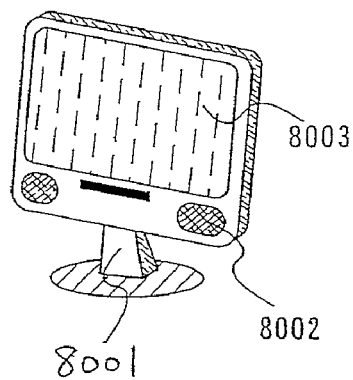
FIGS. 8A to 8D are examples showing electronic apparatuses to which the invention is applied.

FIG. 8A shows a display device which includes a housing 8001, an audio output portion 8002, a display portion 8003, and the like. The display device of the invention can be used for the display portion 8003. Note that, the display device includes all the information display devices for personal computers, television broadcast reception, advertisement displays, and the like.

Figure 8B:
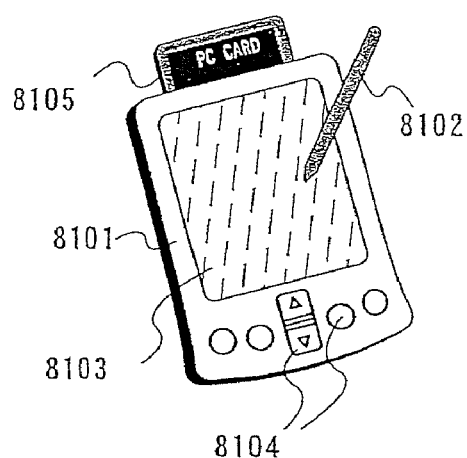

FIG. 8B shows a mobile computer which includes a main body 8101, a stylus 8102, a display portion 8103, operation keys 8104, an external interface 8105, and the like. The display device of the invention can be used for the display portion 8103.

Figure 8C:
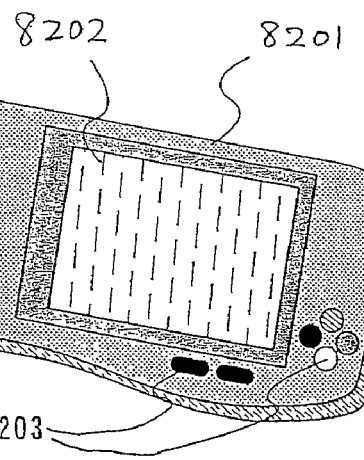

FIG. 8C shows a game machine which includes a main body 8201, a display portion 8202, operation keys 8203, and the like. The display device of the invention can be used for the display portion 8202.

Figure 8D:
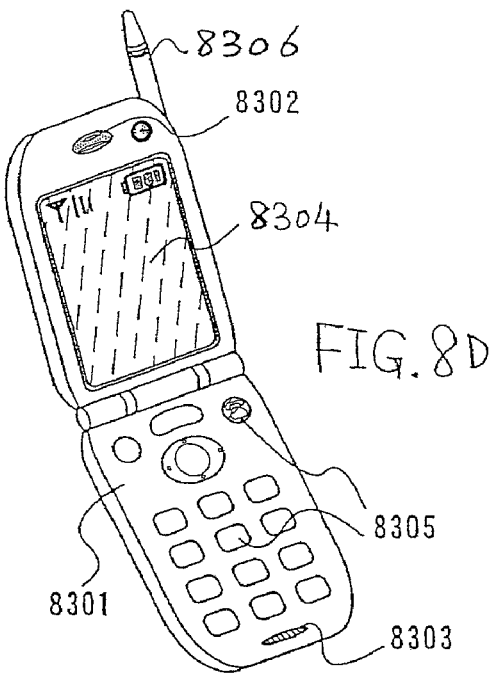
Figure 9:
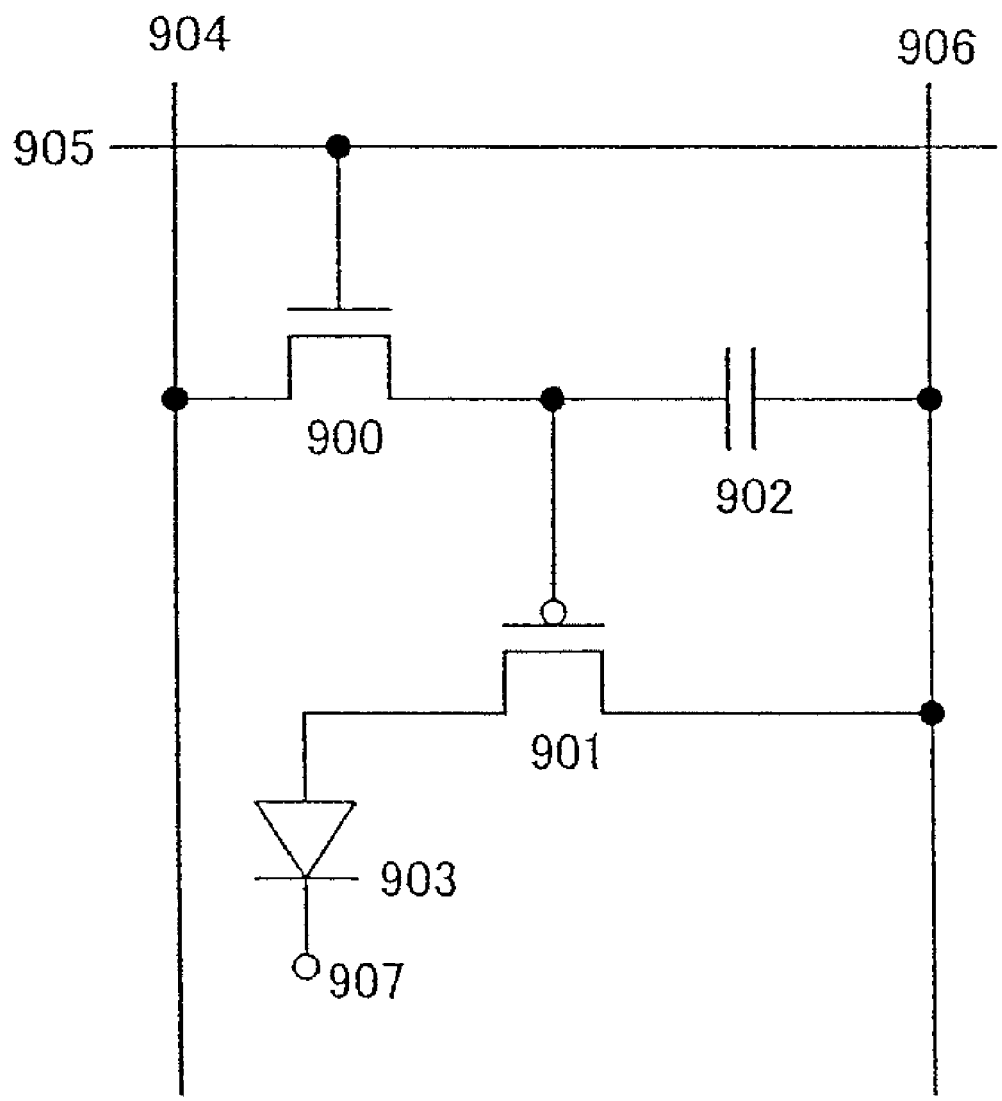
FIG. 9 is a diagram of an embodiment.

FIG. 8D shows a cellular phone which includes a main body 8301, an audio output portion 8302, a display portion 8304, operation switches 8305, an antenna 8306, and the like. The display device of the invention can be used for the display portion 8304.

As described above, an application range of the invention is so wide that the invention can be applied to electronic apparatuses in various fields.

Although the invention has been fully described by way of example with reference to the accompanying drawings, it is to be understood that various modifications will be apparent to those skilled in the art. Therefore, unless otherwise such changes and modifications depart from the scope of the invention hereinafter defined, they should be constructed as being included therein.

What is claimed is:

1. A light emitting device comprising:
   a first transistor;
   a second transistor;
   a third transistor;
   a fourth transistor;
   a first line;
   a second line;
   a third line;
   a fourth line;
   a capacitor; and
   a light emitting element,
   wherein:
   a channel formation region of the second transistor and a channel formation region of the fourth transistor are formed of a same semiconductor island;
   a channel formation region of the first transistor and a channel formation region of the third transistor are formed of a same semiconductor island;
   a conductivity type of the first transistor and a conductivity of the third transistor is the same;
   one of a source and a drain of the first transistor is electrically connected to the third line;
   the other of the source and the drain of the first transistor is directly connected to one of a source and a drain of the third transistor;
   a gate of the first transistor is directly connected to one electrode of the capacitor;
   the gate of the first transistor is directly connected to one of a source and a drain of the fourth transistor;
   the gate of the first transistor is electrically connected to one of a source and a drain of the second transistor through a first metal;
   the first metal comprises a region that overlaps with a part of the second line;
   a first gate of the second transistor is directly connected to the second line;
   a second gate of the second transistor is electrically connected to the second line;
   the third line comprises a region that overlaps with a part of the channel formation region of the first transistor;
   the other of the source and the drain of the third transistor is directly connected to the light emitting element;
   the other of the source and the drain of the fourth transistor is directly connected to the fourth line;
   a first gate of the fourth transistor is directly connected to the first line;
   a second gate of the fourth transistor is electrically connected to the first line;
   the other electrode of the capacitor is directly connected to the third line;
   the third line is a power supply line;
   the light emitting element comprises:
   a first electrode;
   a layer comprising an organic light emitting compound over the first electrode; and
   a second electrode over the layer;
   a luminescence from the organic light emitting compound is passed through the second electrode; and
   a ratio of a channel length to a channel width of the first transistor is different from a ratio of a channel length to a channel width of the third transistor.

2. The light emitting device according to claim 1, wherein the other of the source and the drain of the second transistor is directly connected to the third line.

3. The light emitting device according to claim 1, wherein a gate of the third transistor is directly connected to the third line.

4. The light emitting device according to claim 1, wherein the semiconductor island forming the channel formation region of the second transistor and the channel formation region of the fourth transistor is a different semiconductor island from the semiconductor island forming the channel formation region of the first transistor and the channel formation region of the third transistor.

5. The light emitting device according to claim 1, wherein the ratio of the channel length to the channel width of the third transistor is larger than the ratio of the channel length to the channel width of the first transistor.

6. The light emitting device according to claim 1, wherein the third transistor is a driving transistor for driving the light emitting element.

7. The light emitting device according to claim 1, wherein the third transistor is a depletion mode transistor for driving the light emitting element.

8. The light emitting device according to claim 1, wherein the fourth transistor is a switching transistor.

9. The light emitting device according to claim 1, wherein the first transistor is a current controlling transistor.

10. The light emitting device according to claim 1, wherein the first transistor is an enhancement mode transistor.

11. The light emitting device according to claim 1, wherein the first line is a scan line.

12. The light emitting device according to claim 1, wherein the second line is a scan line.

13. The light emitting device according to claim 1, wherein the fourth line is a signal line.

14. The light emitting device according to claim 1, wherein the channel length of the first transistor is longer than the channel width of the first transistor.

15. The light emitting device according to claim 1, wherein the first transistor has a P-type conductivity.

16. The light emitting device according to claim 1, wherein the first transistor has an N-type conductivity.

17. The light emitting device according to claim 1, wherein the light emitting element is formed over the third transistor.

18. A light emitting device comprising:
   a first transistor;
   a second transistor;
   a third transistor;
   a fourth transistor;
   a first line;

a second line;
a third line;
a fourth line;
a capacitor; and
a light emitting element, wherein:
a channel formation region of the second transistor and a channel formation region of the fourth transistor are formed of a same semiconductor island;
a channel formation region of the first transistor and a channel formation region of the third transistor are formed of a same semiconductor island;
a conductivity type of the first transistor and a conductivity of the third transistor is the same;
one of a source and a drain of the first transistor is electrically connected to the third line;
the other of the source and the drain of the first transistor is directly connected to one of a source and a drain of the third transistor;
a gate of the first transistor is directly connected to one electrode of the capacitor;
the gate of the first transistor is directly connected to one of a source and a drain of the fourth transistor;
the gate of the first transistor is electrically connected to one of a source and a drain of the second transistor through a first metal;
the first metal comprises a region that overlaps with a part of the second line;
a first gate of the second transistor is directly connected to the second line;
a second gate of the second transistor is electrically connected to the second line;
the third line comprises a region that overlaps with a part of the channel formation region of the first transistor;
the other of the source and the drain of the third transistor is directly connected to the light emitting element;
the other of the source and the drain of the fourth transistor is directly connected to the fourth line;
a first gate of the fourth transistor is directly connected to the first line;
a second gate of the fourth transistor is electrically connected to the first line;
the other electrode of the capacitor is directly connected to the third line;
the light emitting element comprises:
a first electrode;
a layer comprising an organic light emitting compound over the first electrode; and
a second electrode over the layer;
a luminescence from the organic light emitting compound is passed through the second electrode; and
a ratio of a channel length to a channel width of the first transistor is different from a ratio of a channel length to a channel width of the third transistor.

19. The light emitting device according to claim 18, wherein the other of the source and the drain of the second transistor is directly connected to the third line.

20. The light emitting device according to claim 18, wherein a gate of the third transistor is directly connected to the third line.

21. The light emitting device according to claim 18, wherein the semiconductor island forming the channel formation region of the second transistor and the channel formation region of the fourth transistor is a different semiconductor island from the semiconductor island forming the channel formation region of the first transistor and the channel formation region of the third transistor.

22. The light emitting device according to claim 18, wherein the ratio of the channel length to the channel width of the third transistor is larger than the ratio of the channel length to the channel width of the first transistor.

23. The light emitting device according to claim 18, wherein the third transistor is a driving transistor for driving the light emitting element.

24. The light emitting device according to claim 18, wherein the third transistor is a depletion mode transistor for driving the light emitting element.

25. The light emitting device according to claim 18, wherein the fourth transistor is a switching transistor.

26. The light emitting device according to claim 18, wherein the first transistor is a current controlling transistor.

27. The light emitting device according to claim 18, wherein the first transistor is an enhancement mode transistor.

28. The light emitting device according to claim 18, wherein the first line is a scan line.

29. The light emitting device according to claim 18, wherein the second line is a scan line.

30. The light emitting device according to claim 18, wherein the fourth line is a signal line.

31. The light emitting device according to claim 18, wherein the channel length of the first transistor is longer than the channel width of the first transistor.

32. The light emitting device according to claim 18, wherein the first transistor has a P-type conductivity.

33. The light emitting device according to claim 18, wherein the first transistor has an N-type conductivity.

34. The light emitting device according to claim 18, wherein the light emitting element is formed over the third transistor.

* * * * *